United States Patent
Uchida et al.

(10) Patent No.: US 7,453,623 B2
(45) Date of Patent: Nov. 18, 2008

(54) REFLECTING MIRROR AND EXPOSURE APPARATUS USING THE SAME

(75) Inventors: Shinji Uchida, Utsunomiya (JP);
Choshoku Sai, Utsunomiya (JP);
Katsumi Asada, Utsunomiya (JP);
Hirohito Ito, Utsunomiya (JP); Shigeo Sakino, Higashimurayama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/408,881

(22) Filed: Apr. 21, 2006

(65) Prior Publication Data
US 2006/0245035 A1 Nov. 2, 2006

(30) Foreign Application Priority Data
Apr. 28, 2005 (JP) ............................... 2005-131834

(51) Int. Cl.
G02B 26/00 (2006.01)
G02B 26/08 (2006.01)
G02F 1/29 (2006.01)

(52) U.S. Cl. ..................... 359/291; 359/292; 359/298
(58) Field of Classification Search .............. 359/223, 359/224, 290, 291, 298, 292, 295
See application file for complete search history.

(56) References Cited

U.S. PATENT DOCUMENTS

| | | | | |
|---|---|---|---|---|
| 3,860,884 A | * | 1/1975 | Chang et al. | 372/4 |
| 4,162,825 A | * | 7/1979 | Dowty | 359/847 |
| 4,836,092 A | * | 6/1989 | Heubner et al. | 92/48 |
| 5,444,566 A | * | 8/1995 | Gale et al. | 359/291 |
| 6,043,863 A | * | 3/2000 | Ikeda | 355/53 |
| 6,393,373 B1 | | 5/2002 | Duyar et al. | |
| 6,842,277 B2 | | 1/2005 | Watson | |
| 2003/0133087 A1 | * | 7/2003 | Shima | 355/53 |

FOREIGN PATENT DOCUMENTS

| | | |
|---|---|---|
| JP | 2004-64076 A | 2/2004 |
| WO | WO-02/12948 A2 | 2/2002 |

* cited by examiner

Primary Examiner—Ricky L Mack
Assistant Examiner—Brandi N Thomas
(74) Attorney, Agent, or Firm—Canon USA Law I.P. Div

(57) ABSTRACT

A mirror apparatus including a reflecting mirror reflecting light, partition walls, the walls and the reflecting mirror defining a plurality of air chambers, and a regulator regulating air pressure in at least one of the air chambers. With this configuration, the front surface of the reflecting mirror is deformed into a smooth shape so as to correct optical aberration.

15 Claims, 10 Drawing Sheets

REFLECTING MIRROR AND EXPOSURE APPARATUS USING THE SAME

BACKGROUN OF THE INVENTION

1. Field of the Invention

The present invention relates to a reflecting mirror adapted to be approprietly used as part of an optical projection system incorporated in a projection exposure apparatus.

2. Description of the Related Art

Heretofore, a photolithographic process for manufacturing a semiconductor element, utilizes an optical projection unit for projecting a pattern formed on a mask (or a reticle) onto a photosensitive substrate such as a wafer by way of an optical projection system in order to expose the substrate with the pattern. There has been used, as the projection exposure apparatus, an exposure apparatus of a static expousure type, such as a step-and-repeat type optical reduction exposure apparatus (a so-called stepper) or an exposure apparatus of a scanning expsoure type such as a slit scanning type exposure apparatus.

Conventionally, in the above-mentioned exposure apparatus, g-ray (having a wavelength of 436 nm), i-ray (having a wavelength of 365 mn) or the like has been used as exposure light. In recent years, Kr Excimer laser light (having a wave length of 248 mn), ArF Excimer light (having a wave length of 193 nm) or the like are being used. In order to carry out exposure with the use of exposure light in the above-mentioned wavebands, by using a cata-diptoric optical system as the optical projection system, satifactory scale efficiency can be obtained, and accordingly, there has been exhibited such an advantage that the optical projection system can be miniaturized.

The above-mentioned cate-dioptric optical projection system includes various kinds of reflecting optical elements (optical projection elements) such as plane mirrors and reflecting mirrors.

By the way, various factors detrioate the optical performance of the exposure apparatus. For example, optical abberation is caused by errors in manufacture and assembly of optical projection elements and thermal deformantion caused by heat induced by exposure light during the operation of the unit, and accordingly, the image quality on the photosenstive substrate (wafer) is deteriorated. As a result, the abberation should be corrected by changing the surface shape of the reflecting mirror.

For example, as disclosed in Japanese Patent Laid-Open No. 2004-64076 (corresponding to U.S. Pat. No. 6,842,277) (Refer to FIG. 9), force actuators 54 are provided to a reflecting mirror 52 on the side remote from the reflecting surface thereof in order to transmit defromation forces to the rear surface of the reflecting mirror from the force actuators 54 through the intermediary of mechanical links 51 (Refer to FIG. 10A) connecting between the force actutors and the rear surface of the reflecting mirror. As a result, the front surface of the reflecting mirror is deformed into a desired shape in order to correct the optical abberation. Further, as disclosed in WO 02/12948 (corresponding to U.S. Pat. No. 6,393,373), air cylinders are incorporated as the actuators, and accordingly, derormatin forces F are transmitted to the rear surface of the reflecting mirror from the actuators through the intermediary of mechanical links connected to the rear surface of the reflecting mirror. As a result, the front surface of the reflecting mirror is deformed into a desired shape in order to correct optical abberation.

However, in the above-mentioned example, it is necessary to arrange several actuators at the rear surace of the reflecting mirror, and accordingly, the configuration becomes complicated. Further, so many actuators have to be controlled, and accordingly, a control system therefor is complicated. Further, as shown in FIG. 10a, should a mechanical link be used to push and pull the rear surace of the reflecting mirror to which the mechanical links are connected, sectional shapes of parts where the links and the rear surface of the reflecting mirror are connected would be indeed visible at the front surface of the reflecting mirror as shown in FIG. 10b. As a result, in addition to form errors such as mirror surface form errors and deformation errors, error components having high spatial frequencies would be created. In particular, with a configuration including seveal actuators, since several error components would be presented, additional optical abberations having high spatial frequencies would be created, and as a result, an image quality on a light sensitive substrate (wafer) is deteriorated.

SUMMARY OF THE INVENTION

The present invention is directed to a mirror apparatus in which a rear surface of a reflecting mirror is deformed into a smooth shape in order to correct optical abberation.

According to one aspect of the present invetion, a mirror apparatus includes a reflecting mirror reflecting light, partition walls, wherein the partition walls and the mirror define a plurality of air chambers, and a regulator regulating air pressure in at least one of the plurality of air chambers.

Further, according to one aspect of the present invetion, an exposure apparatus includes the above-mentioned mirror apparatus as a part of an optical projection system.

According to the present invention, the front surface of the reflecting mirror can be deformed into a smooth shape in order to correct optical abberation. Further, with the use of the above-mentioned mirror apparatus in an optical projection system in an exposure apparatus, the optical performance of the exposure apparatus can be enhanced, thereby it is possible to manufacture semiconducotr devices with a high quality.

Further features of the present invention will become apparent from the following description of exemplary embodiments (with reference to the attached drawings).

BRIEF DESCRIPTION OF THE SEVERAL VIEWS OF DRAWING

DETAILED DESCRIPTION OF THE INVENTION

First Embodiment

Figure 1A:
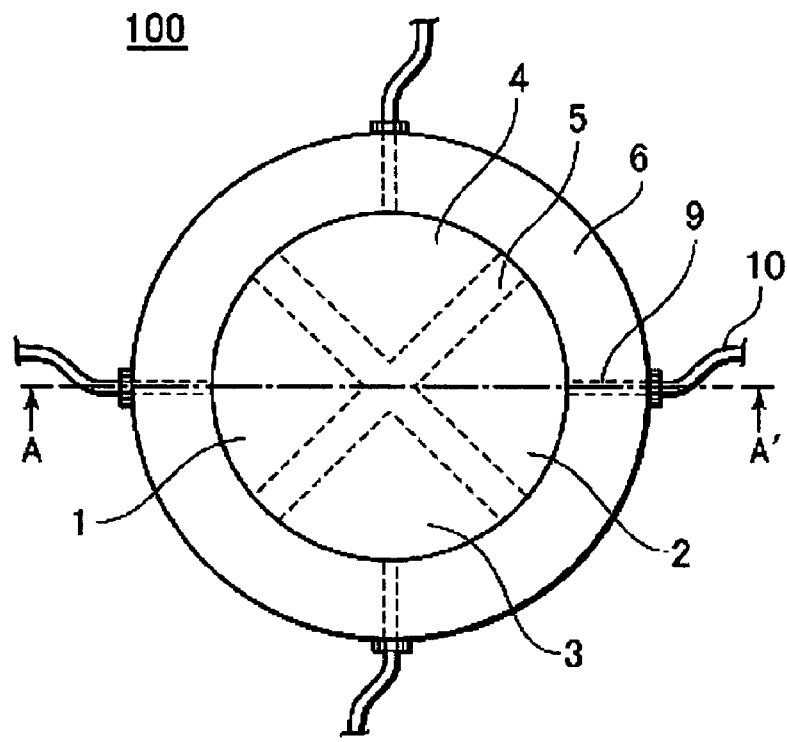
FIGS. 1A and 1B are views schematically illustrating a first embodiment of the presnet invention.
Figure 1B:
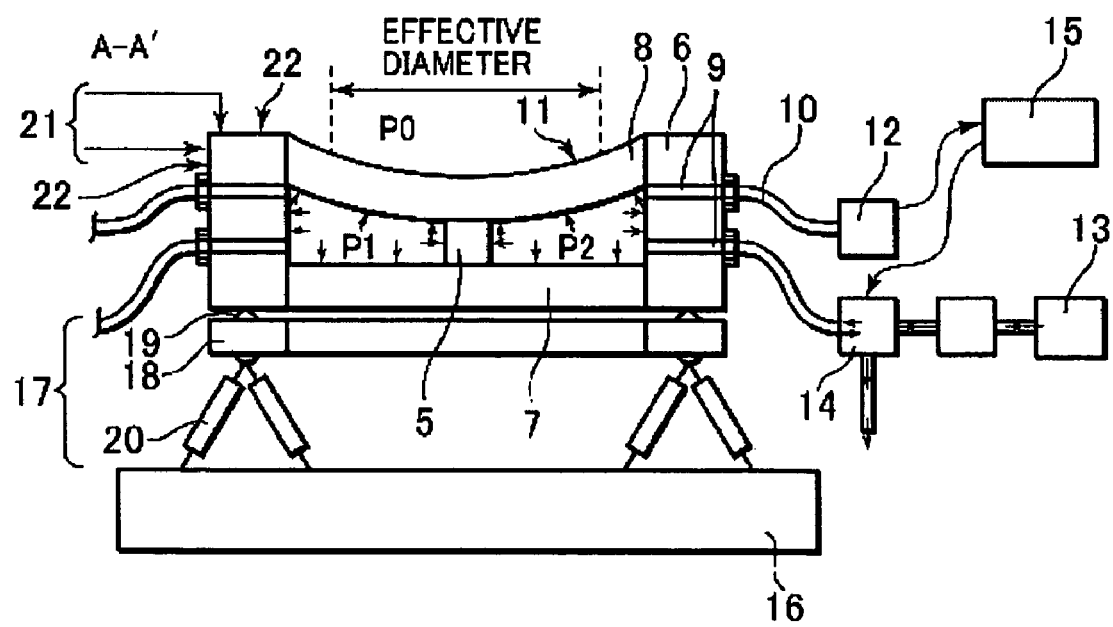

FIG. 1A is a view illustrating a schematic configuration of a mirror apparatus 100 in a first embodiment of the present invention, and FIG. 1B is a sectional view along line A-A' in FIG. 1A. The mirror apparatus 100 can be installed in an exposure apparatus so as to reflect exposure light within an effective diameter range on its reflecting surface, which is deformed into a desired shape at that time in order to correct optical abberation.

The mirror apparatus 100 incorporates therein a concave reflecting mirror 8, partition walls 5 to 7 for defining, together with the reflecting mirror 8, a plurality of air chambers 1 to 4 which are substantially sealed up. The partition walls 5 to 7 include side walls 5 with which the air chambers are defined through partition thereby, an outer peripheral wall 6 surrounding the plurality of air chambers, and a bottom wall 7 opposed to the reflecting mirror 8. The reflecting mirror and the partition walls can be made of a material having a low thermal expansion rate, such as invar, low theraml expansion glass or low thermal expansion ceramics. Further, the plurarity of air chambers are arranged on the side of the reflecting mirror 8 remote from a reflecting surface 11. It is noted here that the wording "sealed up" stated above concerns substantial sealing of such a degree that an enough force can be applied to the reflecting mirror by the air pressure.

The outer peripheral wall 6 is formed therein with air communication holes 9 through which the air chambers communicate with pressure gauges 12 and an air feed pump 13 by way of a tube 10. The air feed pump 13 feeds air into the air chambers. A servo valve 14 is connected between each of the air chambers and the air feed pump 13, and accordingly, the flow rate of the air fed into each of the air chambers is controlled by the servo valve 14. By controlling the flow rate of air fed into each of the air chambers, the pressure in the air chamber can be controlled. Further, the pressures in the air chambers 1 to 4 are controlled, independent from one another.

The pressure gauges 12 and the servo valves 14 can be directly attached to the partition walls 5. However, should the partition walls be deformed by the dead weights of the pressure gauges 12 and the servo valves 14, the thus caused deformation would be transmitted to the reflecting mirror 8 which would therefore be deformed. In order to prevent occurrence of the deformation, the pressure gauges 12 and the servo valves 14 are connected to the air chambers through the intermediary of the tubes 10 having a low stiffness, and accordingly, their dead weights are born by separate support members (which are not shown). In the case of directly attaching the pressure gauges 12 and the servo valves 14 to the partition walls, the thickness of the partition walls can be increased in parts where they are attached, in order to increase the stiffness thereof.

Further, in order to prevent the reflecting mirror 8 from being deformed by heat generated from the pressure gauges 12 and the servo valves 14, it is effective to connect them to the air chambers through the intermediary of the tubes 10 having a low stiffness so as to isolate the reflecting mirror 8 from the heat sources. Alternatively, it is effective to arrange a cooling unit (which is not shown) around the pressure gauges 12 and the servo valves 14 in order to cool them.

Air pressure (which will be hereinbelow denoted P0) outside of the air chambers is measured by a pressure gauge which is not shown. A controller 15 computes air pressures P1 to P4 which are required for deformation of the reflecting mirror 8, from the air pressure P0 and a desired deformation value of the reflecting mirror, and delivers instructions to the servo valves. For this computation, there may be used a correlation between desired deformation values and air pressures which has been stored in the controller 15 in the form of a function. Alternatively, there can be used a correlation between desired deformation values and air pressures, which has been obtained through experimentation and simulations and which has been stored in the controller 15 in the form of a table. The servo valves regulate air quantities fed into the air chambers and air quantities discharged from the air chambers in order to change air pressures in the respective air chambers. The air pressures in the respective air chambers P1 to P4 which are measured by the pressure gauges 12 are fed back to the controller 15. Thus, the air pressures in the respective air chambers 15 are controlled. It is noted here that if an exhaust pump (which is not shown) is used together with the air feed pump 13, the pressures P1 to P4 may be set to be higher or lower than the pressure P0. As a result, the reflecting mirror may be deformed. Any of various kinds of regulators which can adjust the air pressure in the air chamber may be appropriately used. Explanation will be hereinbelow made of the deformation of the reflecting mirror.

It is estimated that the air pressures P1 to P4 are effected in the air chambers with the air pressure P0 outside the air chambers. In this embodiment, differential pressure P1-P, P2-P0, P3-P0, P4-P0 between the respective air chambers and outside of the chambers are controlled as deformation forces for the reflecting mirror 8. That is, the air pressures are regulated in order to deform the shape of the reflecting mirror.

Figure 2:
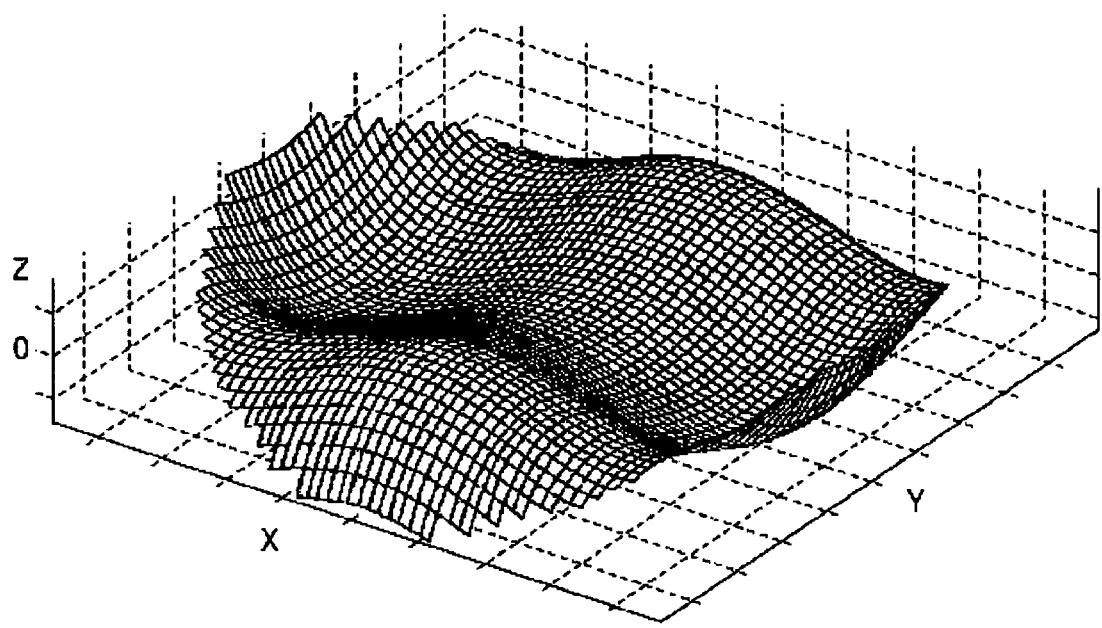
FIG. 2 is a view illustrating an example of a deformed shape of a mirror surface.

FIG. 2 is a view illustrating an example of a deformed shape of the mirror within the effective diameter range of the reflecting mirror 8, which shows a distribution of deformation values at several positions (X- and Y-directions) after the deformation thereof with respect to an initial position 0. For example, if the air pressures P1, P2 are set to be higher than P0 while the pressures P3, P4 are set to be lower than P0, the reflecting mirror is deformed into a convex shape in the parts located within the air chambers 1, 2 but into a concave shape in the parts located within the air chambers 3, 4. FIG. 2 shows the reflecting surface at this time, that is, it is convexly deformed at two positions but is concavely deformed at two positions. Thus, by controlling the air pressures in the air chambers as stated above, the reflecting mirror may be locally deformed, and further, the degree of deformation may also be controlled.

The rear surface of the reflecting mirror 8 substantially defines a surface (pressure receiving surface) for receiving the air pressures within its effective diameter range. Variations in the air pressures in the respective air chambers are received by this overall pressure receiving surface, and accordingly, deformation forces applied to the reflecting mirror may be uniformly received by the overall pressure receiving surface. Namely, no deformation forces applied to the rear surface of the reflecting mirror are locally concentrated, and accordingly, the reflecting surface may be deformed in a smooth shape. A stage unit 17 is located between the reflecting mirror 8 and a reference base 16. An intermediate ring 18 having high stiffness supports the air chambers at three positions through the intermediary of coupling members 19 which are located in the parts having relatively high stiffness in the partition walls, that is, for example, the outer peripheral wall 6 or the bottom plate 7. Further, actuators 20 interposed between the intermediate ring 18 and the reference base 16 are operated while the position of the reflecting mirror 8 or the positions of the air chambers are measured by means of a laser interferometer 21 so as to change the representative positions of the reflecting mirror 8 and degrees of inclination (tilts) thereof.

Figure 3A:
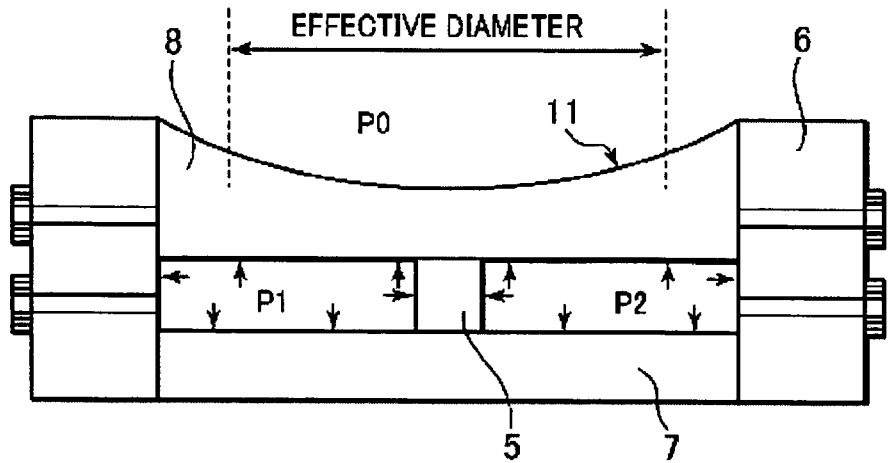
FIGS. 3A to 3C are views illustrating examples of a reflecting mirror.
Figure 3B:
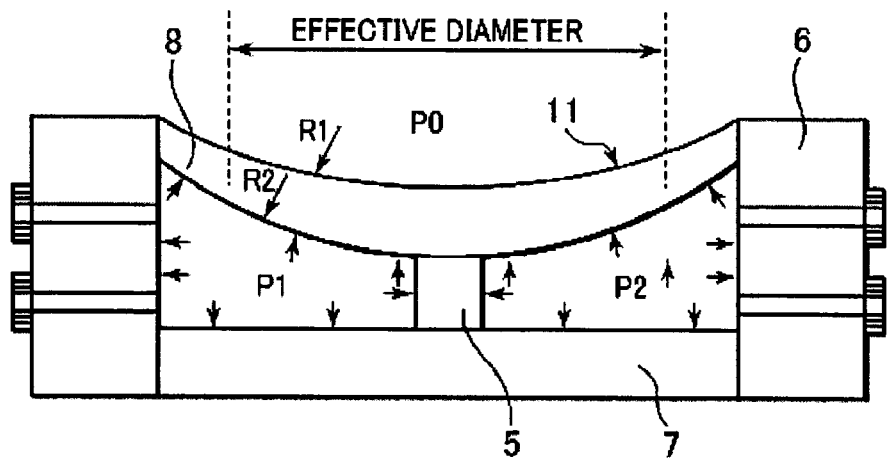
Figure 3C:
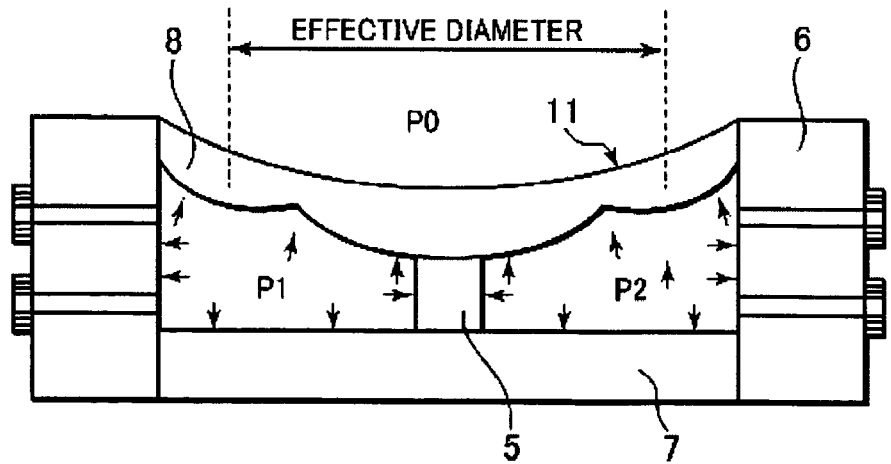

The mirror apparatus 100 in this embodiment can accept correction for various optical aberrations by changing the shape of the reflecting mirror 8 or those of the air chambers 1-4 as well as positions thereof. For example, although the thickness of the reflecting mirror 8 shown in FIG. 1 is uniform, the thickness of the reflecting mirror can be changed as shown in FIGS. 3A to 3C. In the case of changing the thickness, displacements on the reflecting surface which are deformed by the air pressures cause concavities and convexities to be formed in radial directions within the effective diameter range.

Figure 4:
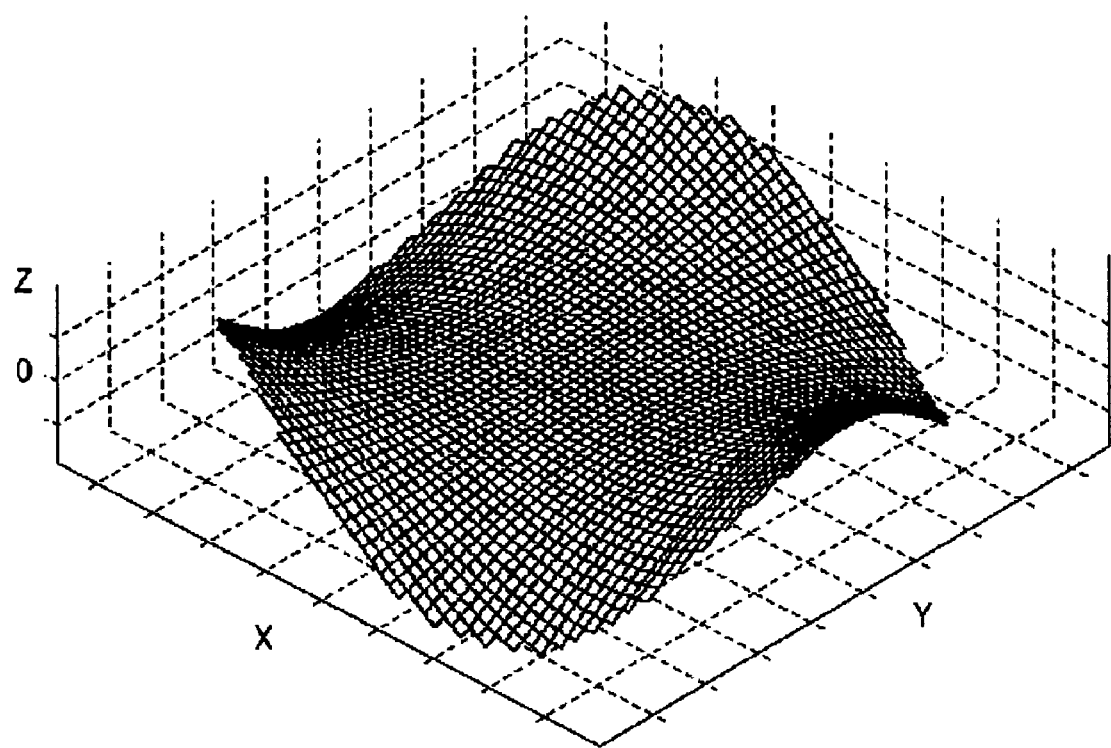
FIG. 4 is a view illustrating an example of a deformed shape of a refleting surface.

It is noted that the number of the air chambers arranged on the rear side of the reflecting mirror 8 is not limited to four. For example., with the provision of three air chambers at angular intervals of 120 deg., displacements on the reflecting surface may cause convexities to be formed at angular intervals of 120 deg., as shown in FIG. 4.

Further, the reflecting mirror 8 and the side walls 5 can be arranged in a noncontact manner with a fine gap therebetween. In this arrangement, it is required to design such a configuration so that air is prevented from passing through the gap between the reflecting mirror 8 and the side walls 5 by a large quantity. For example, the gap is as small as possible or a seal member having low stiffness is provided. With the provision of the noncontact configuration, the reflecting mirror and the side walls may be isolated from each other in view of mechanical stiffness, and accordingly, the reflecting surface may be deformed into a smooth shape in the vicinity of the side walls.

Further, if the side walls 5 are displaceable, the locations of the respective air chambers can be changed. As a result, it is possible to accept various deformation of the front surface of the reflecting mirror 8. That is, it is possible to accept correction for various aberrations.

Further, if the corner parts between the reflecting mirror 8 and the side walls 5 and between the reflecting mirror 8 and the outer peripheral wall 6 are rounded (having a smooth surface with curvature), the reflecting surface can be deformed into a spatially smooth shape in the vicinity thereof.

It is noted that although the pressure gauges 12 are used as control sensors in this embodiment, displacement gauges may also be used. For example, the displacement of the reflecting surface outside of the effective diameter range is measured above the air chambers 1-4, and thus, control can be made with the use of the relationship between the thus obtained local displacements and the shape of the reflecting surface, which has been previously obtained.

The mirror apparatus 100 in this embodiment can cope with correction for various optical aberrations by changing the shape of the reflecting mirror 8 or those of the air chamber 1-4 or changing the position of the air chambers. As a result, the mirror apparatus can correct optical aberrations due to errors in manufacture and assembly of optical projection elements, and due to thermal deformation caused by heat of exposure light during operation of an exposure apparatus.

In comparison with a process of deforming a reflecting mirror with actuators, according to this embodiment, the reflecting mirror surface can be deformed into a smooth shape so as to correct optical aberration. Further, since no complicated mechanism is required, it is advantageous in view of the costs thereof.

Second Embodiment

Figure 5A:
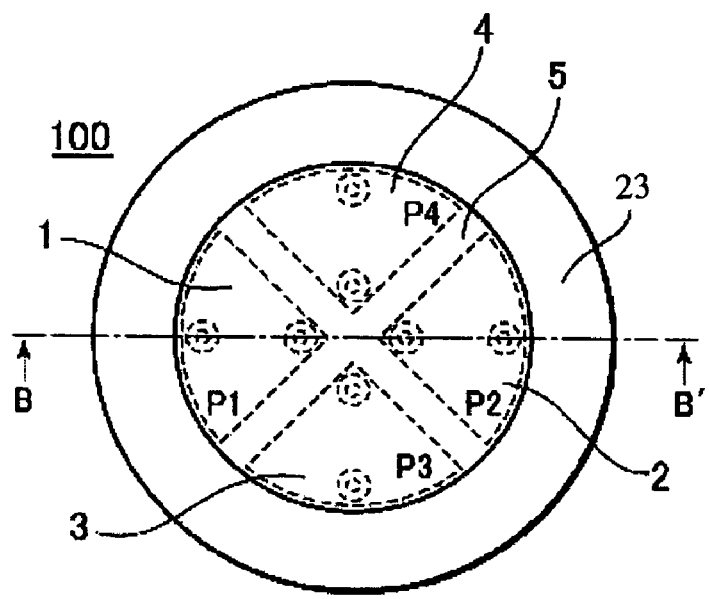
FIGS. 5A and 5B are views illusrating a second embodiment of the present inveniton.
Figure 5B:
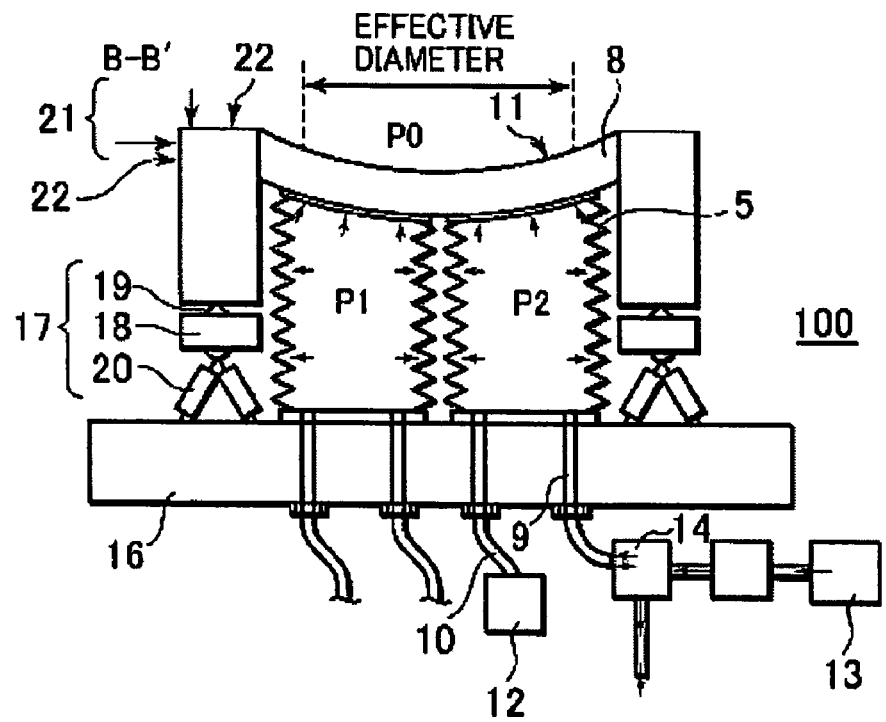

FIG. 5*a* is a view illustrating a schematic configuration of a mirror apparatus 100 in a second embodiment of the present invention, and FIG. 5*b* is a sectional view along line B-B'. Explanation will be mainly made of arrangements different from those in the first embodiment while explanation of the arrangements the same as that of the first embodiment will be omitted. The mirror apparatus 100 reflects exposure light in its effective diameter range on the reflecting surface thereof, and deforms the reflecting surface into a desired shape at that time so as to correct optical aberration.

The reflecting mirror incorporates therein a concave reflecting mirror 8, support portions 23 having high stiffness, for supporting the mirror, and partition walls defining a plurality of air chambers 1 to 4 which are substantially sealed, together with the reflecting mirror. The partition walls includes side walls 5 having low stiffness and a base level block 16. The reflecting mirror 8, the base level block 16 and the support portions 23 can be made of materials having a small thermal expansion coefficient, such as, invar, glass having a low expansion coefficient or ceramics having a low expansion coeffcient.

The base level block 16 is formed therein with communication ports 9, and accordingly, the air chambers are connected to pressure gauges 12 and an air feed pump 13 by way of the communication ports 9 and tubes 10. Servo valves 14 are provided between the air chambers and the air feed pump 13 so as to control the flow rate of air fed to the air chambers. By controlling the flow rate of air fed into the air chambers, pressures in the air chambers may be controlled. As a regulator for regulating the air pressure, there can be used any of various kinds of units capable of regulating air pressures in the air chambers. Further, the air pressures in the air chambers can be controlled, independent from one another.

A stage unit 17 is arranged between the reflecting mirror 8 and the reference level block 16 so as to enable the reflecting mirror 8 to change its representative positions and degrees of inclination (tilts), similar to the first embodiment.

The deformation of the reflecting mirror 8 is similar to that in the first embodiment, and accordingly, the explanation thereof will be omitted.

The mirror apparatus 100 in the embodiment of the present invention can accept correction for various optical aberration by changing the shapes and positions of the reflecting mirror 8 and the air chambers 1-4, similar to the first embodiment. As a result, the reflection mirror apparatus can correct and/or reduce optical aberrations due to errors in manufacture and assembly of optical projection elements, and also due to thermal deformation caused by heat of exposure light during operation of the exposure apparatus.

According to this embodiment, in comparison with a method in which a reflecting mirror 8 is deformed by actuators, the reflecting mirror surface may be deformed in a smooth shape so as to correct optical aberration. Further, no complicated mechanism is required, thereby it is advantageous in view of its costs.

Third Embodiment

Figure 6:
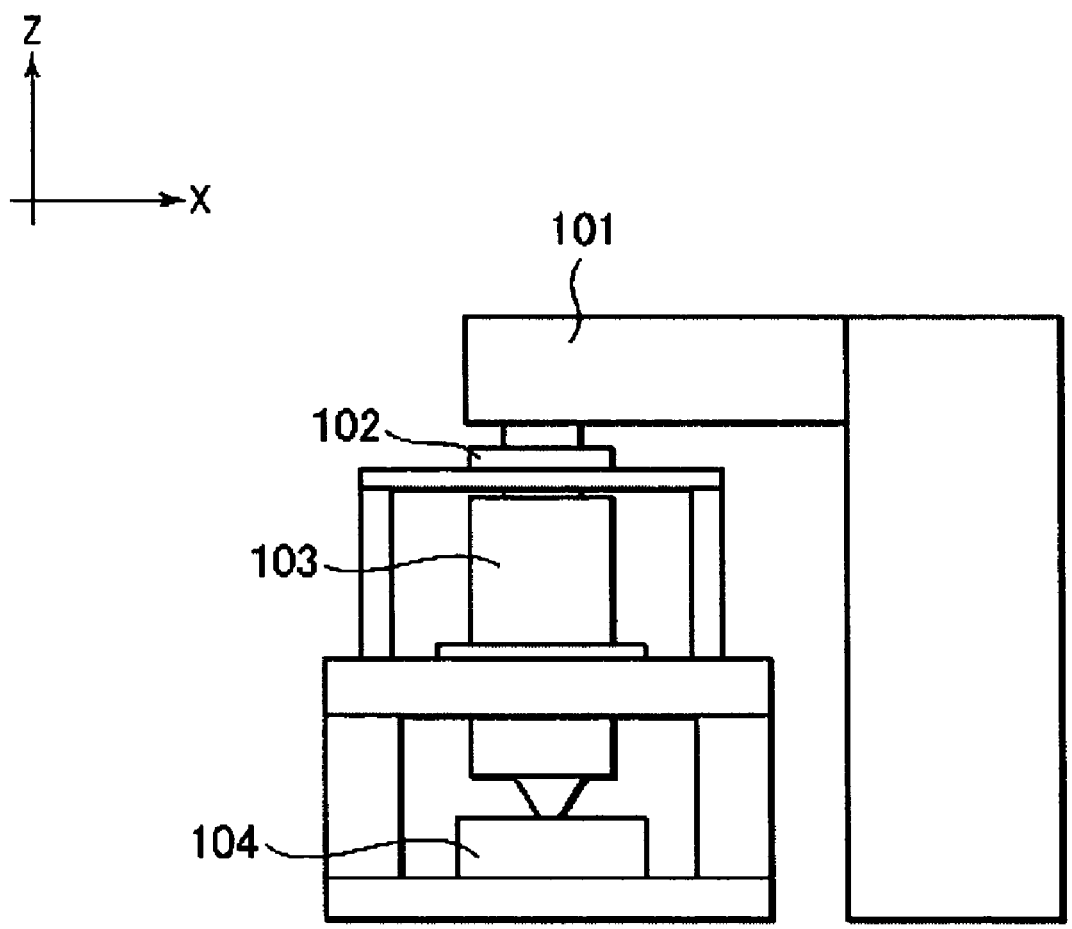
FIG. 6 is a view illustrating an exposure apparatus using a refleting mirror apparatus.

Explanation will be made of an exposure apparatus in an exemplified form, which is applied thereto with the mirror apparatus according to the present invention. Referring to FIG. 6, the exposure apparatus includes an illumination system 101, a reticle stage 102 mounted thereon with a reticle, a projection optical system 103, and a wafer stage 104 mounting a wafer thereon. The exposure apparatus is adapted to project a circuit pattern formed on the reticle onto the wafer which is therefore exposed thereto, and can be of a step-and-repeat projection exposure type or a step-and-scan projection exposure type.

The illumination system 104 illuminates the reticle on which the circuit pattern is formed, and includes a light source portion and an illumination optical system. The light source portion can utilize, as a light source, for example, laser such as ArF excimer laser having a wavelength of about 193 nm, KrF excimer laser having a wavelength of about 248 nm or F2 excimer laser of about 153 nm. However, the kind of laser is not limited to excimer lasers alone, but YAG lasers can be also used. The number of laser sources are not limited to a specific one. In the case of using laser as the light source, there can be used a light beam shaping optical system for shaping a parallel ray light beam emitted from the laser source into a desired beam shape, and an incoherent optical system for converting a coherent light beam into an incoherent light beam. Further, the light source portion is not limited to laser, but there can be used one or more of lamps such as a mercury lamp or an xenon lamp.

The illumination optical system is an optical system for illuminating a mask, and includes lenses, mirrors, a light integrator and a diaphragm.

As the optical projection system 103, there can be used an optical system (cata-dioptric optical system) having at least one concave mirror, an all mirror type optical system or the like. The mirror apparatus 100 in the first or second embodiment is used as at least a part of this optical projection system. The reticle stage 102 and the wafer stage 104 can be displaced by, for example, linear motors. In the case of the step-and-scan projection exposure type, the respective stages are displaced, in synchronization with each other. Further, an additional actuator is incorporated to at least either one of the wafer stage and the reticle stage in order to align the pattern on the reticle with the wafer.

The above-mentioned exposure apparatus is adapted to be used for a manufacture of a device formed therein with a micro pattern, for example, a semiconductor device such as a semiconductor integrated circuit, a micro machine or a thin film magnetic head.

With the use of the mirror apparatus 100 in at lease a part of the optical projection system, there can be corrected and/or reduced optical aberration due to errors in manufacture and assembly of optical projection elements, and also due to thermal deformation caused by heat of exposure light during operation of the exposure apparatus, and thereby it is possible to carry out exposure with a high degree of accuracy.

Figure 7:
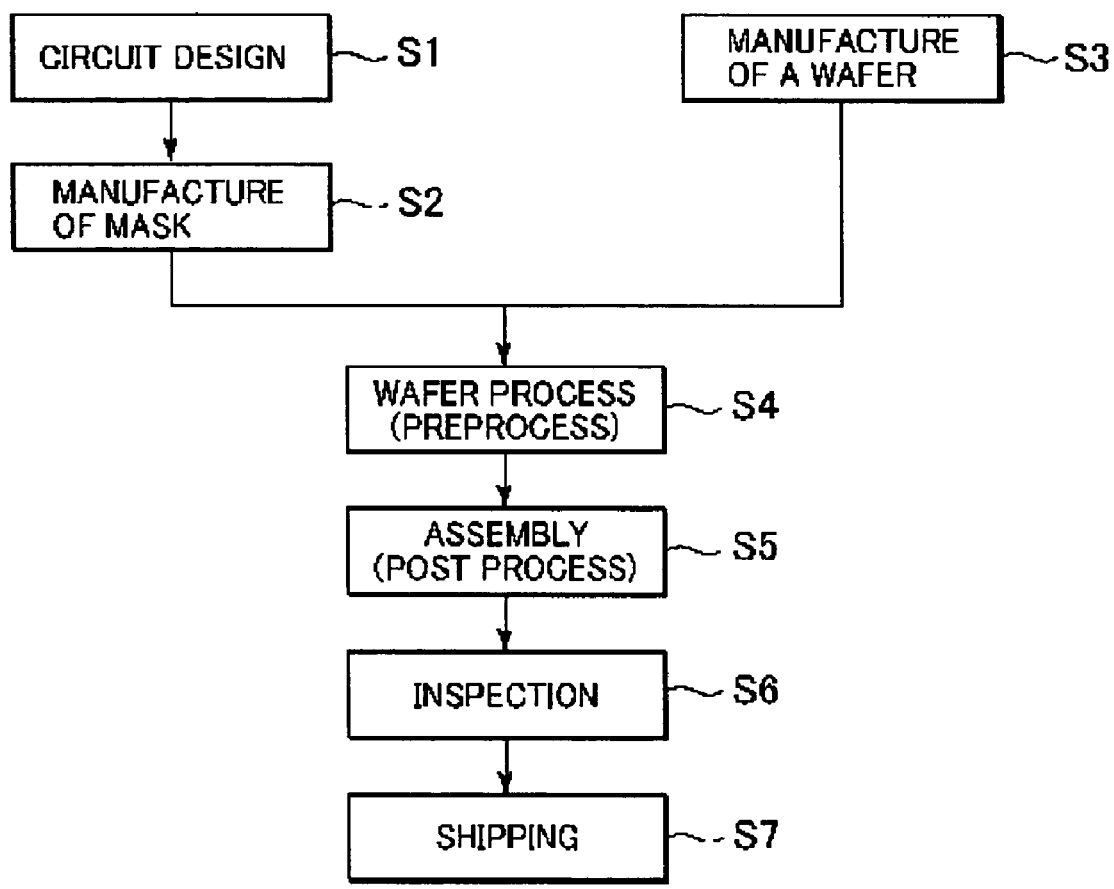
FIG. 7 is a flow chart for explaining a manufacture of a device used in the exposure apparatus.

Next, an explanation will be made of an embodiment of a device manufacture method utilizing the above-mentioned exposure apparatus with reference to FIGS. 7 and 8. FIG. 7 is a flow-chart for explaining a manufacture of a device (a semiconductor chip such as IC or LSI, LCD, CCD and the like). In this embodiment, a method of manufacturing a semiconductor chip as an example, will be explained.

At step S1 (circuit design), a circuit of the semiconductor device is designed. At step S2 (manufacture of a mask), a mask is manufactured based upon the designed circuit pattern. At step S3 (manufacture of a wafer), a wafer is made from silicon. At step S4 (wafer process), that is, the so-called preprocess, with the use of the mask and the wafer, an actual circuit is formed on the wafer through lithography by the above-mentioned exposure apparatus. At step S5 (assembly), that is, the so-called post process, a semiconductor chip is formed from the wafer manufactured at step S4. Step S5 includes process steps such an assembly step (dicing, bonding) and a package step (enclosing a chip). At step S6 (inspection), an operation confirming test and an endurance test for the semiconductor device manufactured at step S5 are carried out. The semiconductor device is completed through the above-mentioned steps, and at step S7, shipping thereof is carried out.

Figure 8:
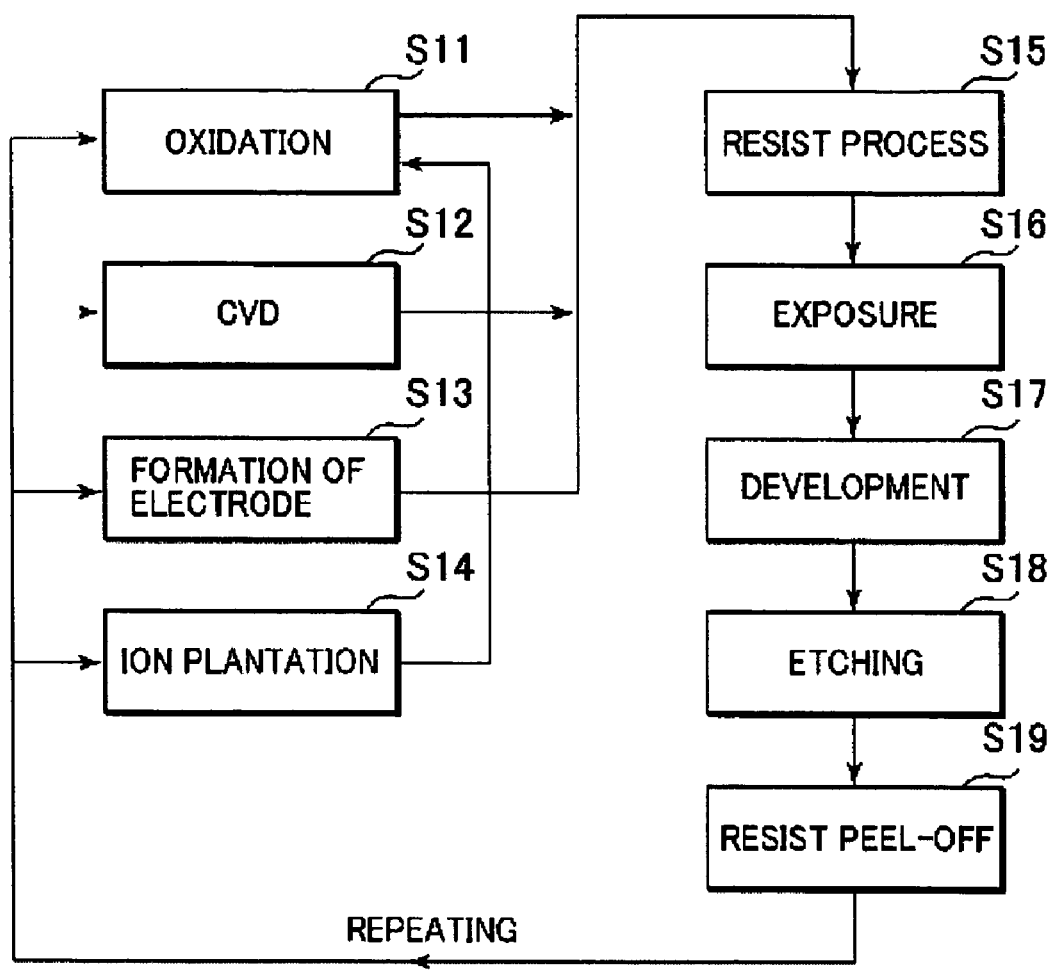
FIG. 8 is a flow chart for explaning, in detail, a wafer process at step 4 in the flow chart shown in FIG. 7.
Figure 9:
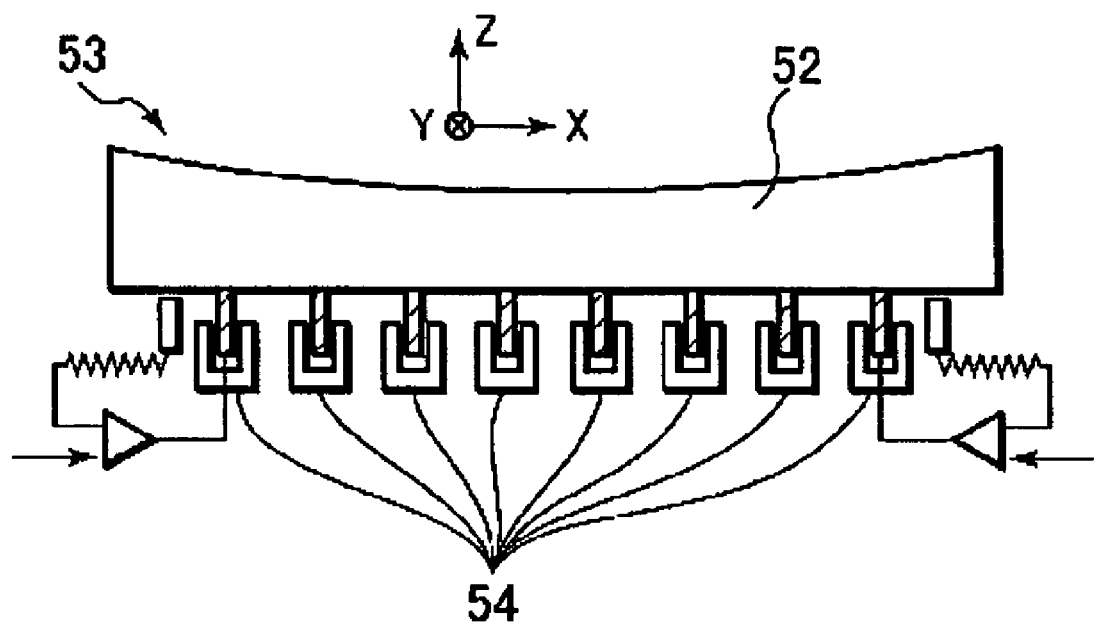
FIG. 9 is a view exemplifying a configuration of a conventional deformable type reflecting mirror appratus.
Figure 10A:
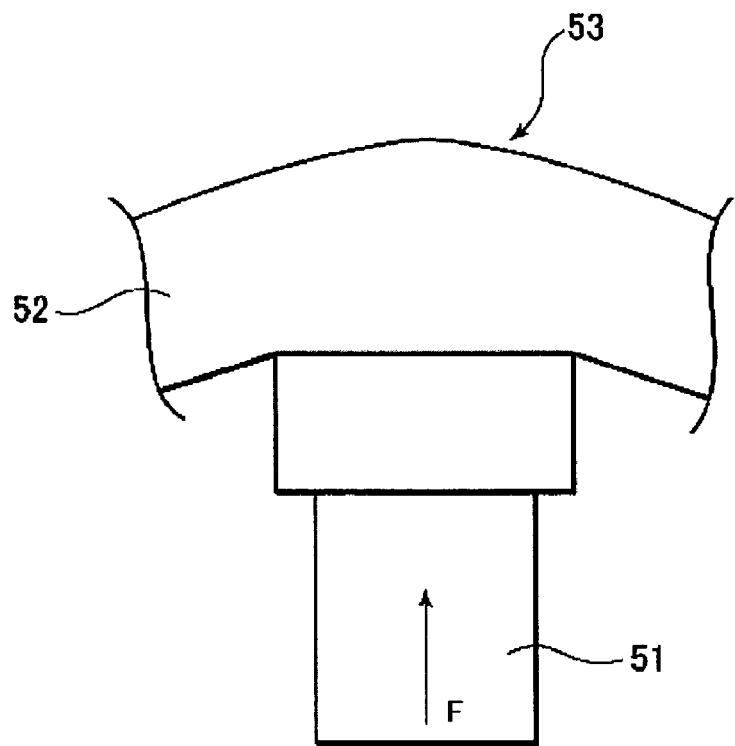
FIGS. 10A and 10B are views for explaining a problem inherent in the conventional example.
Figure 10B:
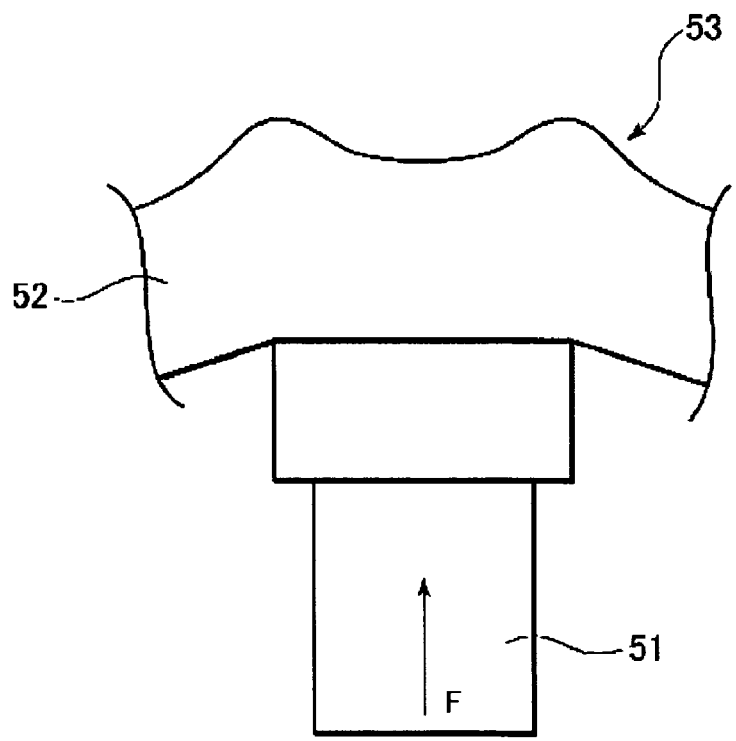

FIG. 8 is a flow chart for explaining the wafer process step S4 in detail. At step S11 (oxidation), the front surface of the wafer is oxidized. At step S12 (CVD), an insulation film is formed on the front surface of the wafer. At step S13 is formation of an electrode. At step S14 (ion plantation), ions are planted into the wafer. At step S15 (resist process), the wafer is coated thereover with a photosensitive material. At step S16 (exposure), the circuit pattern on the mask is projected onto the wafer which is therefore exposed by the exposure apparatus. At step S17 (development), the thus exposed wafer is developed. At step 18 (etching), the photosensitive material is scraped in the part other than a resist image. At step S19 (resist removal), the resist which becomes unnecessary after completion of the etching is removed. With the repetitions of the steps as stated above, circuit patterns are formed on the wafer in multi-layers.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Laid-Open No. 2005-131834, filed Apr. 28, 2005, which is hereby incorporated by reference herein in its entirety.

What is claimed is:

1. A mirror apparatus comprising:
a mirror including a rear surface and a reflecting surface configured to reflect light;
a partition member defining a plurality of gas chambers on a side of the rear surface of the mirror, a part of the rear surface, the part being one of a plurality of parts divided within an effective diameter range of the mirror, forming a part of an inside surface of the plurality of gas chambers;
a regulator regulating gas pressure in each gas chamber in order to apply a deformation force to the part of the rear surface;
a measuring unit configured to measure the gas pressure in each gas chamber; and
a measuring unit configured to measure gas pressure outside of the gas chambers,
wherein the gas pressure in each gas chamber is regulated so as to control differential pressure between the gas chambers and the outside of the chambers in order to deform the shape of the mirror.

2. A mirror apparatus according to claim 1, wherein the differential pressure is controlled in order to deform the shape of the reflecting surface of the mirror.

3. A mirror apparatus according to claim 1, further comprising a curved part provided between the mirror and the partition member.

4. A mirror apparatus according to claim 1, wherein there is a gap between the mirror and the partition member.

5. A mirror apparatus according to claim 1, wherein the partition member is displaceable, so as to change locations of the plurality of gas chambers.

6. An exposure apparatus for projecting and exposing a pattern of an original on a substrate, comprising:
an optical projection system having the mirror apparatus according to claim 1.

7. A mirror apparatus according to claim 1, wherein an aberration of the mirror is corrected by the differential pressure.

8. A mirror apparatus according to claim 1, further comprising a controller configured to control the regulator based on a correlation between a deformation value of the mirror and the gas pressure in the gas chambers.

9. A mirror apparatus according to claim 1, wherein the deformation force is uniformly applied to the overall part of the rear surface by the differential pressure.

10. A mirror apparatus according to claim 1, wherein a thickness of the mirror varies within the effective diameter range of the mirror.

11. A mirror apparatus according to claim 1, wherein the partition member includes a base level block and side walls, the side walls having lower stiffness than the base level block.

12. A method of manufacturing a device, comprising:
projecting and exposing a pattern of an original on a substrate with the use of the exposure apparatus according to claim 6; and
developing the substrate.

13. A mirror apparatus comprising:
a mirror including a rear surface and a reflecting surface configured to reflect light;
a partition member defining a plurality of gas chambers on a side of the rear surface of the mirror and around an axis perpendicular to a center of the reflecting surface of the mirror, a part of the rear surface, the part being one of a plurality of parts divided within an effective diameter range of the mirror, forming a part of an inside surface of the plurality of gas chambers;
a regulator regulating gas pressure in each gas chamber in order to apply a deformation force to the part of the rear surface;
a measuring unit configured to measure the gas pressure in each gas chamber; and
a measuring unit configured to measure gas pressure outside of the gas chambers,
wherein the gas pressure in each gas chamber is regulated so as to control differential pressure between the gas chambers and the outside of the chambers in order to deform the shape of the mirror.

14. An exposure apparatus for projecting and exposing a pattern of an original on a substrate, comprising:
an optical projection system having the mirror apparatus according to claim 13.

15. A method of manufacturing a device, comprising:
projecting and exposing a pattern of an original on a substrate with the use of the exposure apparatus according to claim 14; and
developing the substrate.

* * * * *